(12) United States Patent
Lee

(10) Patent No.: US 7,663,592 B2
(45) Date of Patent: Feb. 16, 2010

(54) SYSTEMS INVOLVING SIGNAL DRIVING CIRCUITS FOR DRIVING DISPLAYS

(75) Inventor: Ching-Hone Lee, Hsinchu (TW)

(73) Assignee: TPO Displays Corp., Chu-Nan, Miao-Li County (TW)

( * ) Notice: Subject to any disclaimer, the term of this patent is extended or adjusted under 35 U.S.C. 154(b) by 646 days.

(21) Appl. No.: 11/254,141

(22) Filed: Oct. 19, 2005

(65) Prior Publication Data

US 2007/0085808 A1      Apr. 19, 2007

(51) Int. Cl.
G09G 3/36 (2006.01)

(52) U.S. Cl. .......................... 345/100; 345/98; 345/99; 377/64; 377/78; 377/79

(58) Field of Classification Search ........... 345/98–100; 377/64–81
See application file for complete search history.

(56) References Cited

U.S. PATENT DOCUMENTS

| | | | | |
|---|---|---|---|---|
| 5,150,032 A | * | 9/1992 | Ho | 320/130 |
| 5,861,863 A | * | 1/1999 | Kudo et al. | 345/100 |
| 6,621,481 B1 | * | 9/2003 | Kanbara | 345/100 |
| 6,813,332 B2 | * | 11/2004 | Nagao et al. | 377/79 |
| 6,995,742 B2 | * | 2/2006 | Park et al. | 345/100 |
| 7,057,598 B2 | * | 6/2006 | Azami et al. | 345/100 |
| 7,116,748 B2 | * | 10/2006 | Nagao et al. | 377/79 |
| 2003/0002615 A1 | * | 1/2003 | Morosawa et al. | 377/64 |
| 2005/0201508 A1 | | 9/2005 | Shin et al. | |
| 2006/0001637 A1 | * | 1/2006 | Pak et al. | 345/100 |

FOREIGN PATENT DOCUMENTS

CN          1368971          9/2002

* cited by examiner

Primary Examiner—Alexander Eisen
Assistant Examiner—Viet Pham
(74) Attorney, Agent, or Firm—Thomas, Kayden, Horstemeyer & Risley

(57) ABSTRACT

Systems for driving displays are provided. In this regard, an representative system for driving a display comprises a signal driving circuit having a first shift register and a second shift register coupled in series to the first shift register. The signal driving circuit is operative to drive a display according to inputs provided by only two clock signals.

11 Claims, 9 Drawing Sheets

220

US 7,663,592 B2

SYSTEMS INVOLVING SIGNAL DRIVING CIRCUITS FOR DRIVING DISPLAYS

BACKGROUND

The invention relates to display devices.

High definition, multicolor display, low power consumption, lower voltage requirements and light weight have made liquid crystal displays (LCDs) a leading display device technology. LCDs have been used for several years as mobile information displays in, for example, personal digital assistants (PDAs), portable computers, mobile phones, and the like.

Recently, complementary metal oxide semiconductor (CMOS) shift register circuits have been widely applied in low-temperature poly-silicon (LTPS) LCDs. However, at least eight masks typically are required to form a CMOS shift register circuit during fabrication, and thus, costs are increased. For cost reduction, positive metal-oxide semiconductor (PMOS) shift registers, which require fewer masks, are used frequency by LCD makers.

FIG. 1 shows a conventional signal driving circuit comprising PMOS shift registers. As shown, the signal driving circuit 100 in the panel 10 requires four clock signals provided by an external integrated circuit (IC) to driving the PMOS shift registers via four FPC pins, and four sampling and holding units (L/S) to sample and hold the four clock signals. Because of the increased sampling and holding units (S/L), the power consumption and chip (layout) area are increased no matter they are integrated to the IC or the display panel, and thus cost is increased. Further, due to increase in FPC pins, contact reliability between the IC and panel by FPC becomes an important issue.

SUMMARY

Systems for driving displays are provided. In this regard, an embodiment of such a system comprises a signal driving circuit. The signal driving circuit comprises: a plurality of shift registers connected in series, each comprising a first control terminal, a second control terminal, an input terminal and an output terminal, each being controlled by a first clock signal and a second clock signal and outputting corresponding driving pulses in turn according to a start pulse. The output terminal of an $N^{th}$ of the shift registers is coupled to the input terminal of an $N+1^{th}$ of the shift registers, the output terminal of the $N+1^{th}$ shift register is coupled to the second control terminal of the $N^{th}$ shift register, and the first control terminals of the $N^{th}$ and the $N+1^{th}$ shift registers are coupled to the first clock signal and the second clock signal, respectively.

Another embodiment of a system for driving a display comprises a signal driving circuit. The signal driving circuit comprises: a first shift register comprising a first control terminal coupled to a first clock signal, an input terminal coupled to a start pulse, a second control terminal, and an output terminal, wherein the first shift register outputs a first driving pulse according to the first clock signal and the start pulse; and a second shift register comprising a first control terminal coupled to a second clock signal, an input terminal coupled to the output terminal of the first shift register, an output terminal coupled to the second control terminal of the first shift register, and a second control terminal, wherein the second shift register is operative to output a second driving pulse according to the first clock signal and the first driving pulse, and the first shift register is disabled by the second driving pulse from the second shifter register.

Another embodiment of a system for driving a display comprises a signal driving circuit having a first shift register and a second shift register coupled in series to the first shift register. The signal driving circuit is operative to drive a display according to inputs provided by only two clock signals.

BRIEF DESCRIPTION OF THE DRAWINGS

The invention can be more fully understood by the subsequent detailed description and examples with reference made to the accompanying drawings, wherein.

DETAILED DESCRIPTION

Figure 1:
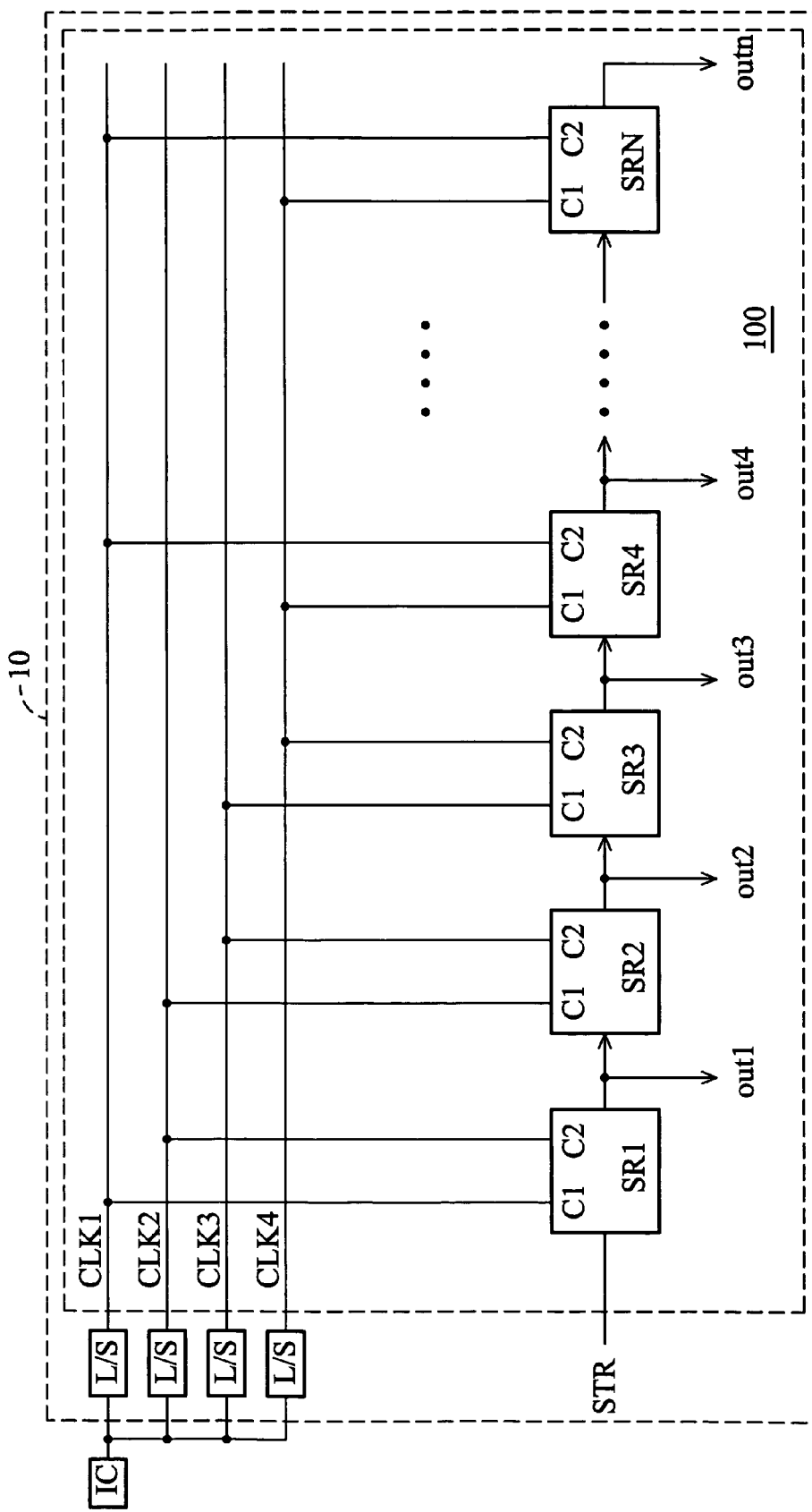
FIG. 1 shows a conventional signal driving circuit having PMOS shift registers.
Figure 2:
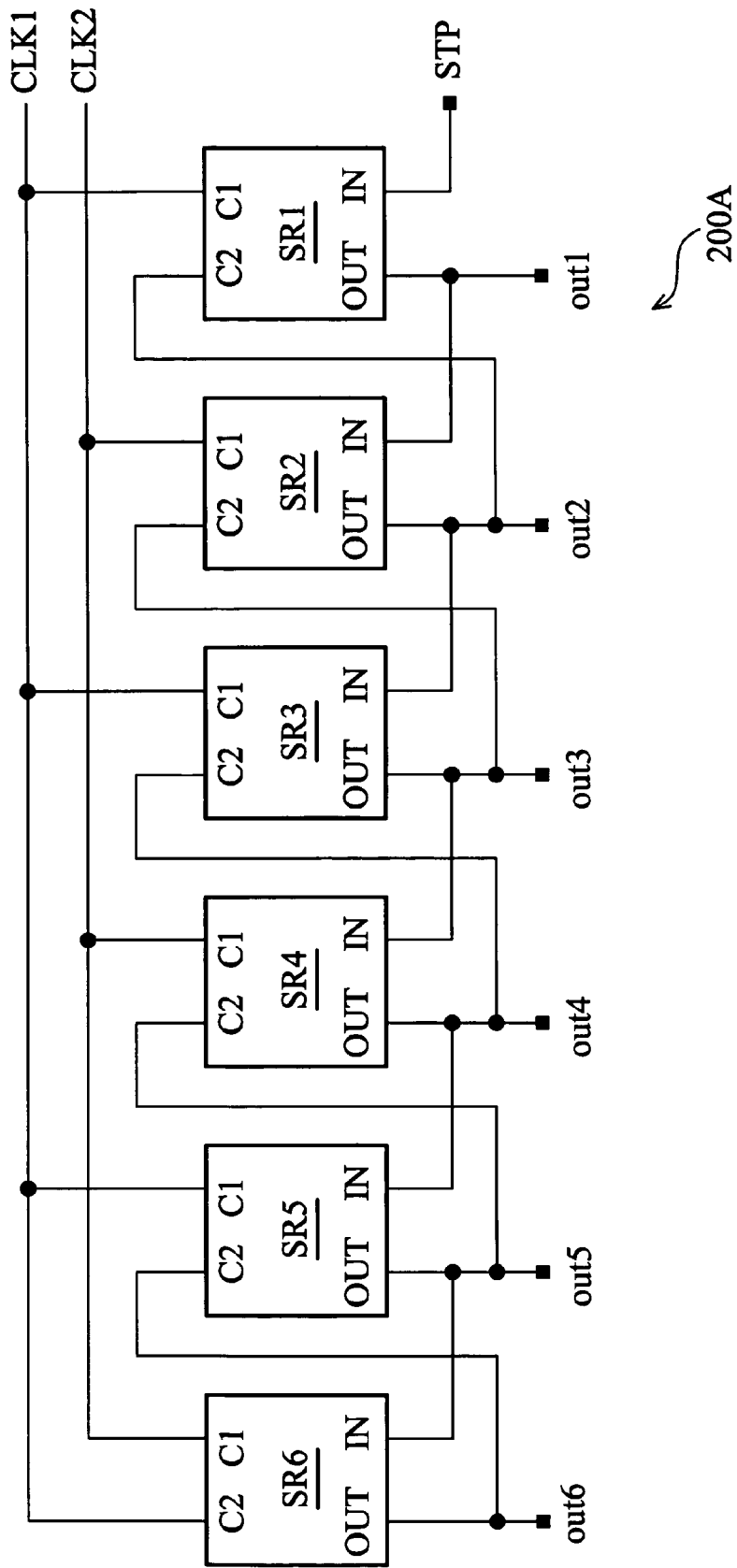
FIG. 2 shows an embodiment of a signal driving circuit.

Systems are provided that involve the use of signal driving circuits. In this regard, FIG. 2 shows a first embodiment of a signal driving circuit. As shown, signal driving circuit 200A comprises 6 shift registers SR1~SR6 connected in series. While this embodiment incorporates 6 shift registers, it is to be understood that in other embodiments, other numbers of shift registers can be used. Each shift register SR1~SR6 comprises a first control terminal C1, a second control terminal C2, an input terminal IN and an output terminal OUT. Shift registers SR1~SR6 are controlled by a first clock signal CLK1 and a second clock signal CLK2 to output corresponding driving pulses in turn, according to a start pulse STP. It is to be noted that the first clock signal CLK1 and the second clock signal CLK2 are not inverse to each other, but have a phase difference therebetween.

The shift register SR1 comprises a first control terminal C1 coupled to the first clock signal CLK1, a second control terminal C2 coupled to the output terminal of the shift register SR2, an input terminal coupled to the start pulse STP and an output terminal outputting a corresponding driving pulse out1. The shift register SR2 comprises a first control terminal C1 coupled to the second clock signal CLK2, a second control terminal C2 coupled to the output terminal of the shift register SR3, an input terminal coupled to the output terminal of the shift register SR1 and an output terminal outputting a corresponding driving pulse out2. The shift register SR3 comprises a first control terminal C1 coupled to the first clock signal CLK1, a second control terminal C2 coupled to the output terminal of the shift register SR4, an input terminal coupled to the output terminal of the shift register SR2 and an output terminal outputting a corresponding driving pulse out3.

The shift register SR4 comprises a first control terminal C1 coupled to the second clock signal CLK2, a second control terminal C2 coupled to the output terminal of the shift register SR5, an input terminal coupled to the output terminal of the shift register SR3 and an output terminal outputting a corresponding driving pulse out4. The shift register SR5 comprises a first control terminal C1 coupled to the first clock signal CLK1, a second control terminal C2 coupled to the output terminal of the shift register SR6, an input terminal coupled to the output terminal of the shift register SR4 and an output terminal outputting a corresponding driving pulse out5. The shift register SR6 comprises a first control terminal C1 coupled to the second clock signal CLK2, a second control terminal C2 coupled to the first clock signal CLK1, an input terminal coupled to the output terminal of the shift register SR5 and an output terminal outputting a corresponding driving pulse out6.

Figure 3:
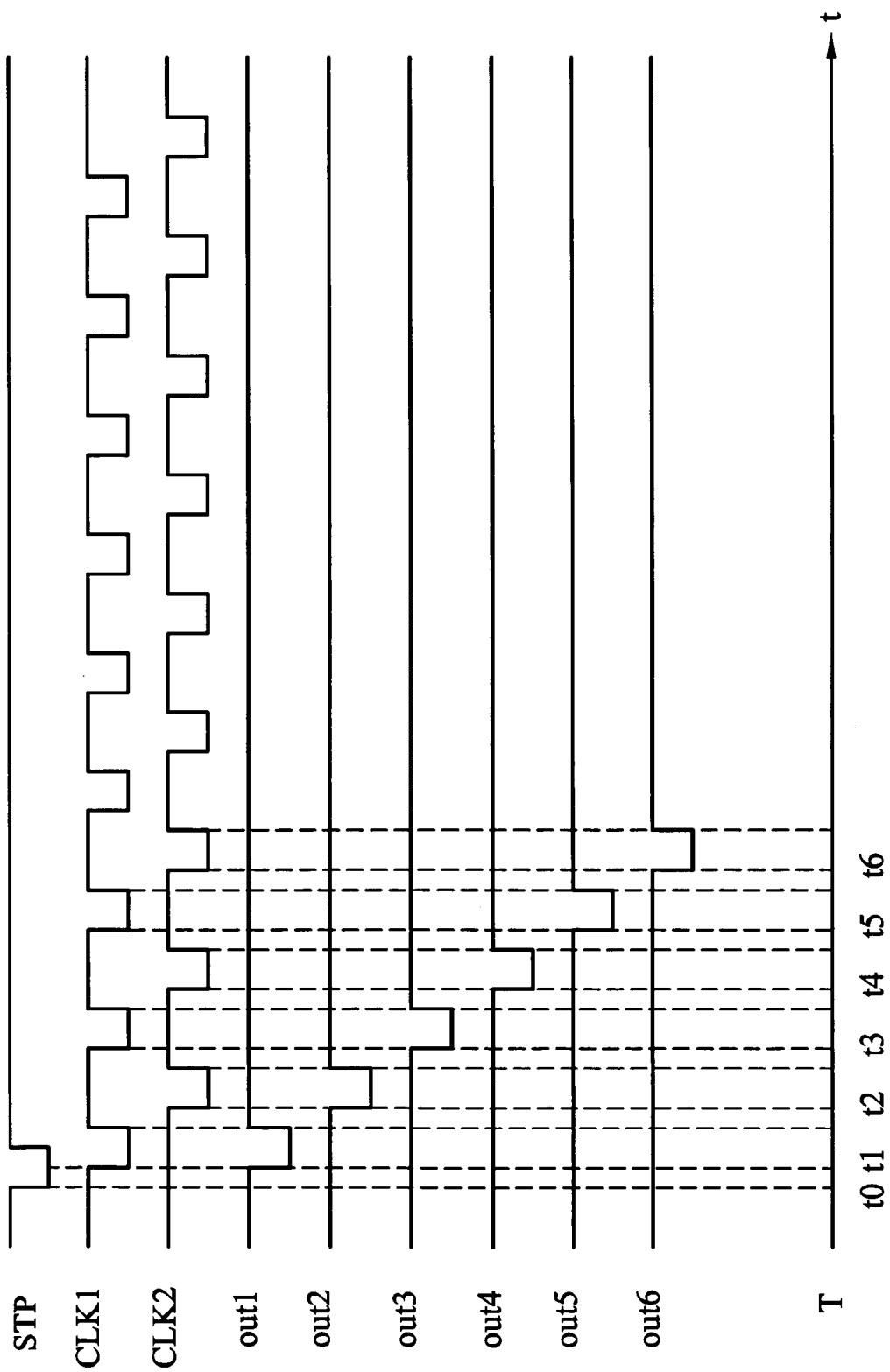
FIG. 3 is a timing chart of the embodiment of the signal driving circuit of FIG. 2.

FIG. 3 is a timing chart of the embodiment of the driving signal circuit of FIG. 2. The shift register SR1 generates corresponding driving pulse out1 for output to the input terminal of the shift register SR2, according to the first clock signal CLK1 and the start pulse STP. For example, after receiving the start pulse STP at time t0, the shift register SR1 can output the corresponding driving pulse out1 when the clock signal CLK1 goes low at time t1.

The shift register SR2 generates corresponding driving pulse out2 for output to the input terminal of the shift register SR3, according to the second clock signal CLK2 and the driving pulse out1 from the shift register SR1. For example, after receiving the driving pulse out1 from the shift register SR1, the shift register SR2 can output the corresponding driving pulse out2 when the clock signal CLK2 goes low at time t2. Similarly, shift registers SR3~SR6 generate and output corresponding driving pulses out3-out6, according to the driving pulse from the previous stage and the corresponding clock signal CLK1 or CLK2. Namely, the shift registers SR~SR6 are controlled by the clock signals CLK1 and CLK2 and output corresponding driving pulses out1~out6 after receiving the start pulse STP. Further, the corresponding driving pulse out2 serves not only as a start pulse for the shift register SR3 but also as a disabling pulse to turn off the shift register SR1. Similarly, corresponding driving pulses out3~out5 serve not only as a start pulse for the shift registers SR4~SR6, respectively, but also as a disabling pulse to turn off the shift registers SR2~SR4, respectively. In this embodiment, the corresponding driving pulse out6 serves only as a disabling pulse to turn off the shift register SR5. Namely, the previous shift ($N^{th}$) register is turned off by the corresponding driving pulse output from the next ($N+1^{th}$) shift register. Note, that in this embodiment shift registers SR1~SR6 have the same structure, and are formed solely by PMOS transistors.

Figure 4:
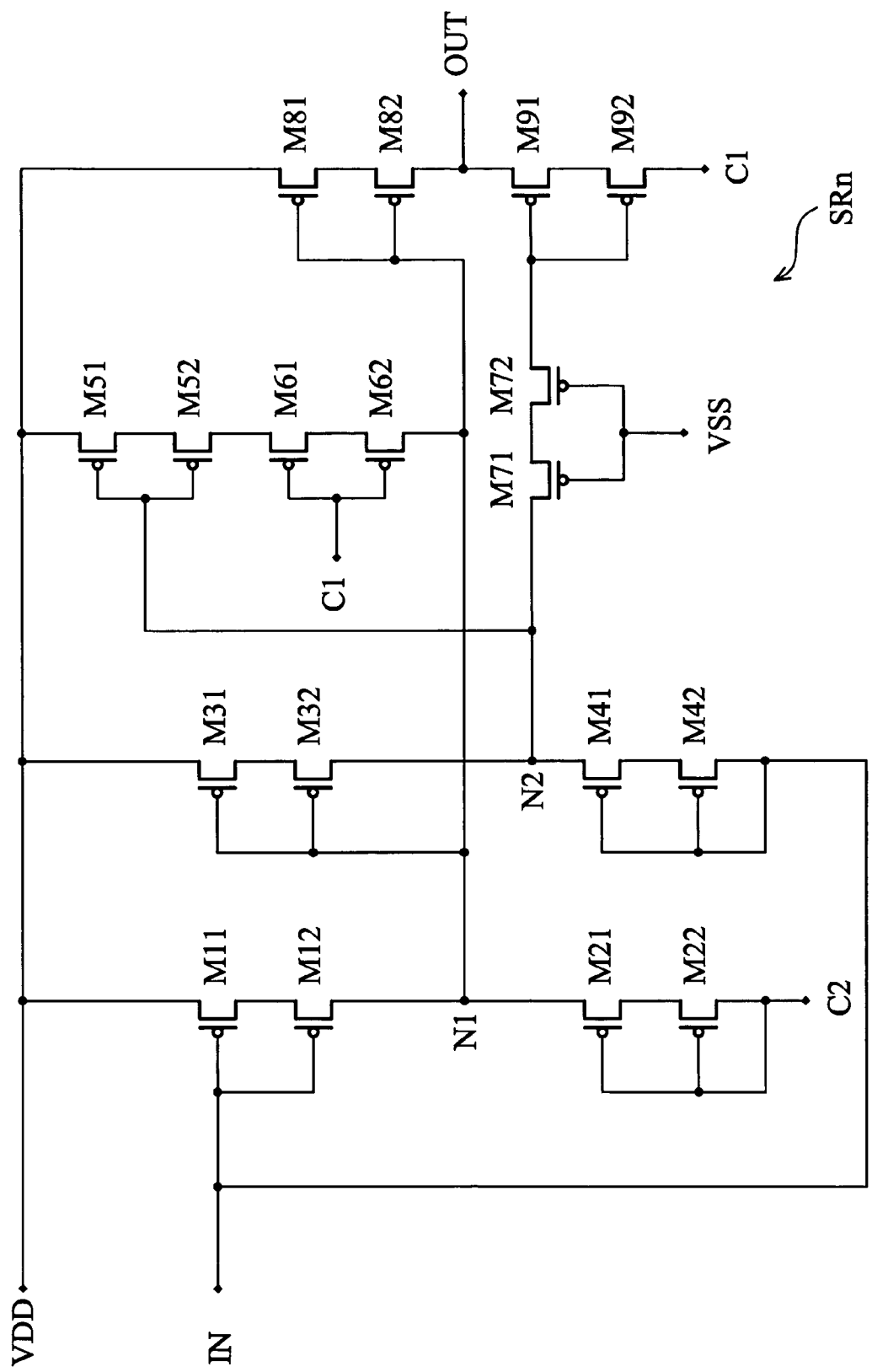
FIG. 4 shows an embodiment of a shift register.

FIG. 4 shows an embodiment of a shift register SRn, in which shift register SRn comprises 18 PMOS transistors. As shown in FIG. 4, the transistor M11 comprises a first terminal coupled to power voltage VDD, a second terminal coupled to transistor M12, and a control terminal serving as a input terminal IN. The transistor M12 comprises a first terminal coupled to the second terminal of the transistor M11, a second terminal coupled to a node N1, and a control terminal coupled to the input terminal IN.

The transistor M21 comprises a first terminal coupled to the node N1, a second terminal and a control terminal coupled to the transistor M22. The transistor M22 comprises a first terminal coupled to the second terminal of the transistor M21, a second terminal serving as a second control terminal C2, and a control terminal coupled to the second control terminal C2 and the control terminal of the transistor M21. The transistor M31 comprises a first terminal coupled to power voltage VDD, a control terminal coupled to the node N1 and a second terminal coupled to transistor M32. The transistor M32 comprises a first terminal coupled to the second terminal of the transistor M31, a second terminal coupled to a node N2, and a control terminal coupled to the node N1.

The transistor M41 comprises a first terminal coupled to the node N2, a control terminal coupled to the input terminal IN and a second terminal coupled to the transistor M42. The transistor M42 comprises a first terminal coupled to the second terminal of the transistor M41, a second terminal coupled to the input terminal IN, and a control terminal coupled to the input terminal IN. The transistor M51 comprises a first terminal coupled to the power voltage VDD, a second terminal coupled to the transistor M52, and a control terminal coupled to the node N2. The transistor M52 comprises a first terminal coupled to the second terminal of the transistor M51, a second terminal coupled to the transistor M61, and a control terminal coupled to the node N2. The transistor M61 comprises a first terminal coupled to the second terminal of the transistor M52, a second terminal coupled to the transistor M62 and a control terminal coupled a first control terminal C1. The transistor M62 comprises a first terminal coupled to the second terminal of the transistor M61, a second terminal coupled to the node N1, and a control terminal coupled to the first control terminal C1.

The transistor M71 comprises a first terminal coupled to the node N2, a second terminal coupled to the transistor M72 and a control terminal coupled a ground voltage VSS. The transistor M72 comprises a first terminal coupled to the second terminal of the transistor M71, a second terminal coupled to the transistor M91, and a control terminal coupled to the ground voltage VSS. The transistor M81 comprises a first terminal coupled to the power voltage VDD, a second terminal coupled to the transistor M82, and a control terminal coupled to the node N1. The transistor M82 comprises a first terminal coupled to the second terminal of the transistor M81, a second terminal serving as an output terminal OUT, and a control terminal coupled to the node N1. The transistor M91 comprises a first terminal coupled to the output terminal OUT, a second terminal coupled to the transistor M92 and a control terminal coupled the second terminal of the transistor M72. The transistor M92 comprises a first terminal coupled to the second terminal of the transistor M91, a second terminal coupled to the first control terminal C1, and a control terminal coupled to the second terminal of the transistor M72.

When the input terminal IN receives a start pulse STP (or corresponding driving pulse from a previous stage), the clock signal CLK2 stays high and the clock signal CLK1 goes low, transistors M21, M22, M31, M32, M81 and M82 are turned off and transistors M11, M12, M41, M42, M51, M52, M61, M62, M71, M72, M91 and M92 are turned on. Since the voltage level of N2 is low and N1 is high, voltage level at output terminal will go low following the CLK1 signal due to M91 and M92 turn on (the shift register SRn generates a corresponding driving pulse). When the clock signal CLK2 stays high and the clock signal CLK1 goes high, the output point will go high with CLK1, node N2 will remain at low level and N1 will remain at high level.

When the clock signal CLK1 stays high and the clock signal CLK2 goes low, the transistors M11, M12, M41, M42, M51, M52, M61, M62, M91 and M92 are turned off and the transistors M21, M22, M31, M32, M71, M72, M81 and M82 are turned on. Thus, the voltage level at the output terminal OUT goes high due to node N2 going high and node N1 goes low. This shift register SRn is disabled.

Because the signal driving circuit of this embodiment requires only two clock signals and is formed by PMOS shift registers, it potentially provides lower cost solution than conventional signal driving circuits with CMOS shift registers and/or those requiring four clock signals.

Figure 5:
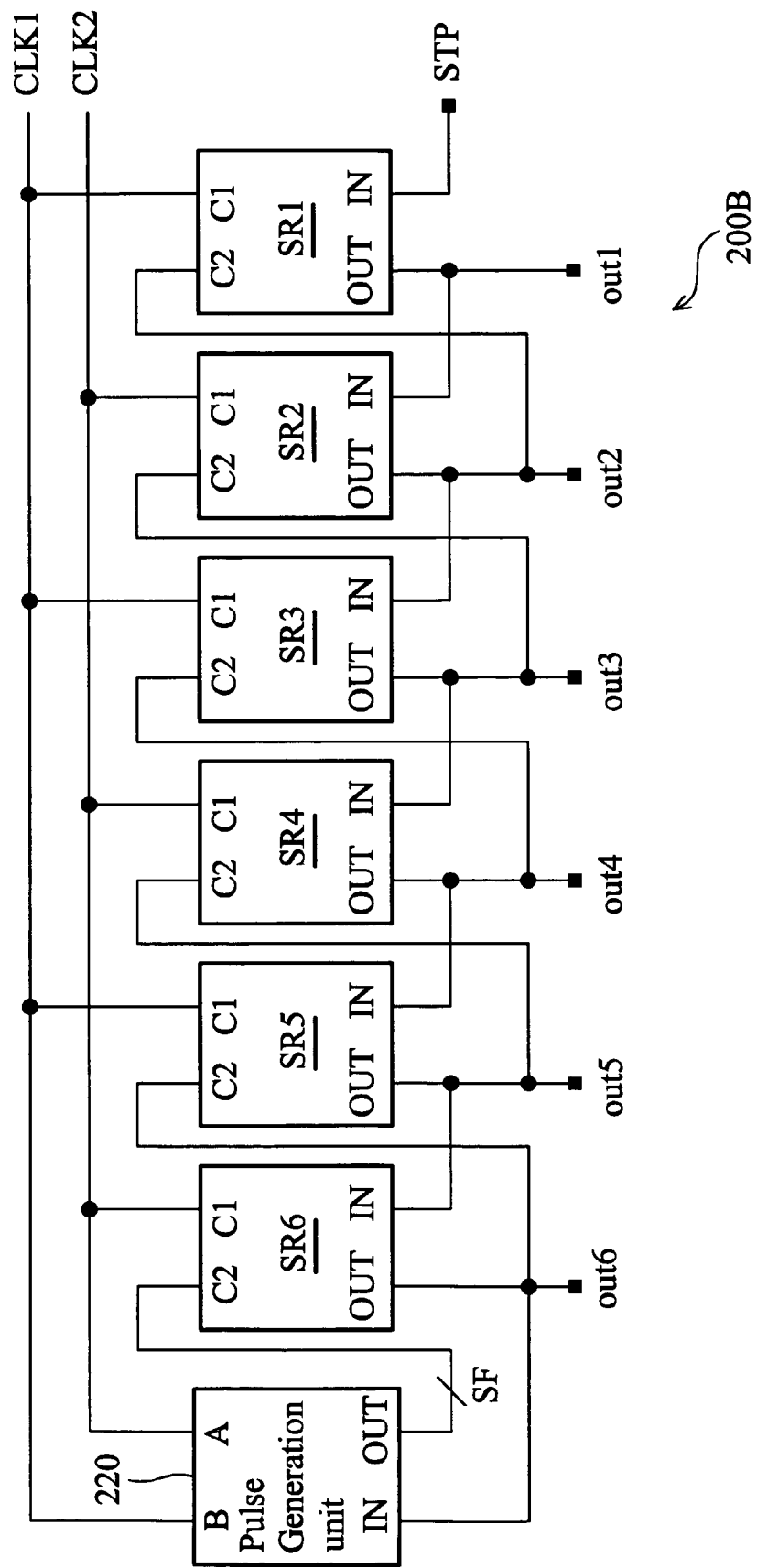
FIG. 5 shows another embodiment of a signal driving circuit.

FIG. 5 shows another embodiment of a signal driving circuit. The signal driving circuit 200B of FIG. 5 comprises 6 shift registers SR1~SR6 and a pulse generation unit 220. The signal driving circuit 200B is similar to the circuit 200 shown in FIG. 2A expect that an additional pulse generation unit 220 is coupled to the last shift register SR6. The pulse generation unit 220 is coupled to the first and second clock signals CLK1 and CLK2 and the corresponding driving pulse out6 from the last shift register SR6. For example, the pulse generation unit 220 comprises control terminals A and B coupled to the clock signal CLK2 and CLK1 respectively, and an input terminal IN coupled to the output terminal of the last shift register SR6 and an output terminal OUT coupled to the second terminal of the last shift register SR6. The pulse generation unit 220 outputs a disable pulse SF to disable the last shift register SR6 according to the corresponding driving pulse out6 and the first and second clock signals.

Figure 6:
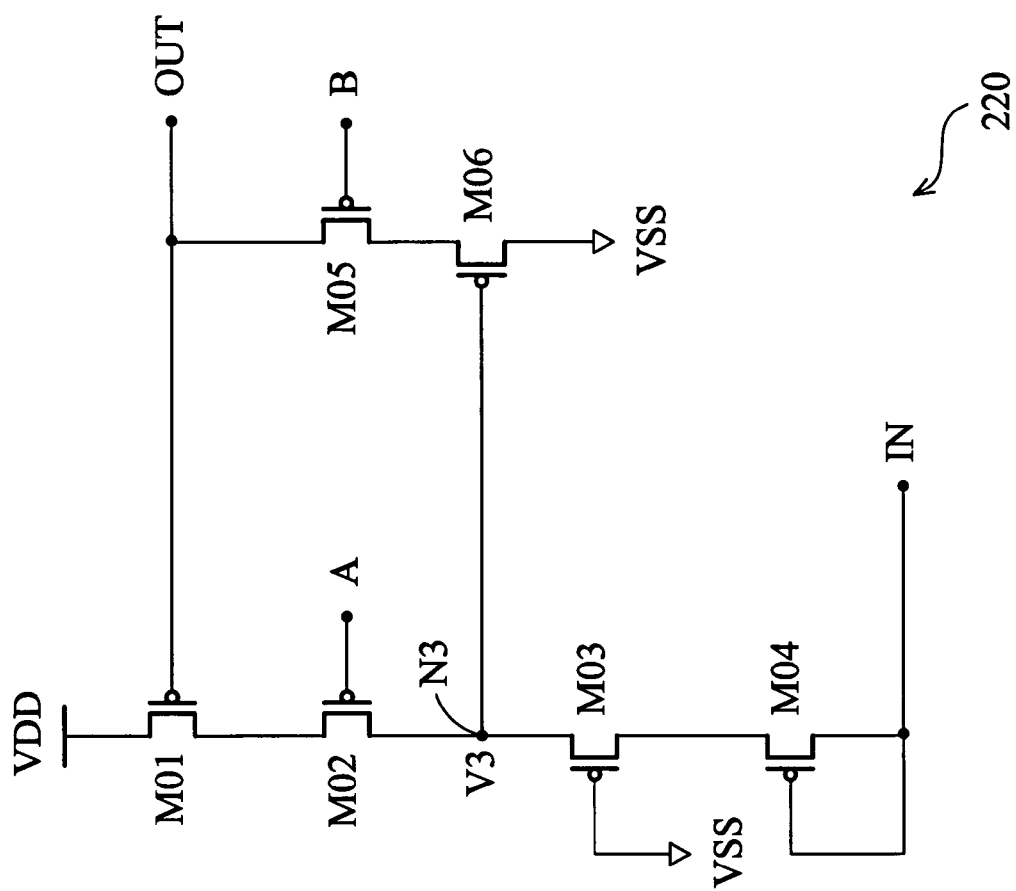
FIG. 6 shows an embodiment of a pulse generation unit.

FIG. 6 shows an embodiment of the pulse generation unit 220. In this embodiment, the pulse generation unit 220 is coupled to the shift register SR6 and comprises 6 PMOS transistors. The transistor M01 comprises a first terminal coupled to the power voltage VDD, a second terminal coupled to the transistor M02, and control terminal coupled to the second control terminal C2 of the shift register SR6. The transistor M02 comprises a first terminal coupled to the second terminal of the transistor M01, a second terminal coupled to a node N3, and a control terminal coupled to the second clock signal CLK2. The transistor M03 comprises a first terminal coupled to the node N3, a second terminal coupled to the first terminal of the transistor M04, and a control terminal coupled to the ground voltage VSS.

The transistor M04 comprises a first terminal coupled to the second terminal of the transistor M03, a second terminal and a control terminal coupled to the output terminal OUT of shift register SR6. The transistor M05 comprises a first terminal coupled to the second control terminal C2 of the shift register SR6, a second terminal coupled to the transistor M06 and a control terminal coupled to the clock signal CLK1. The transistor M06 comprises a first terminal coupled to the second terminal of the transistor M05, a second terminal coupled to the ground voltage VSS, and a control terminal coupled to the node N3.

When the shift register SR6 outputs a corresponding driving pulse out at time t6, the transistors M03 and M04 are turned on such that the voltage level V3 at the node N3 goes low, and the transistor M06 is turned on.

Figure 7:
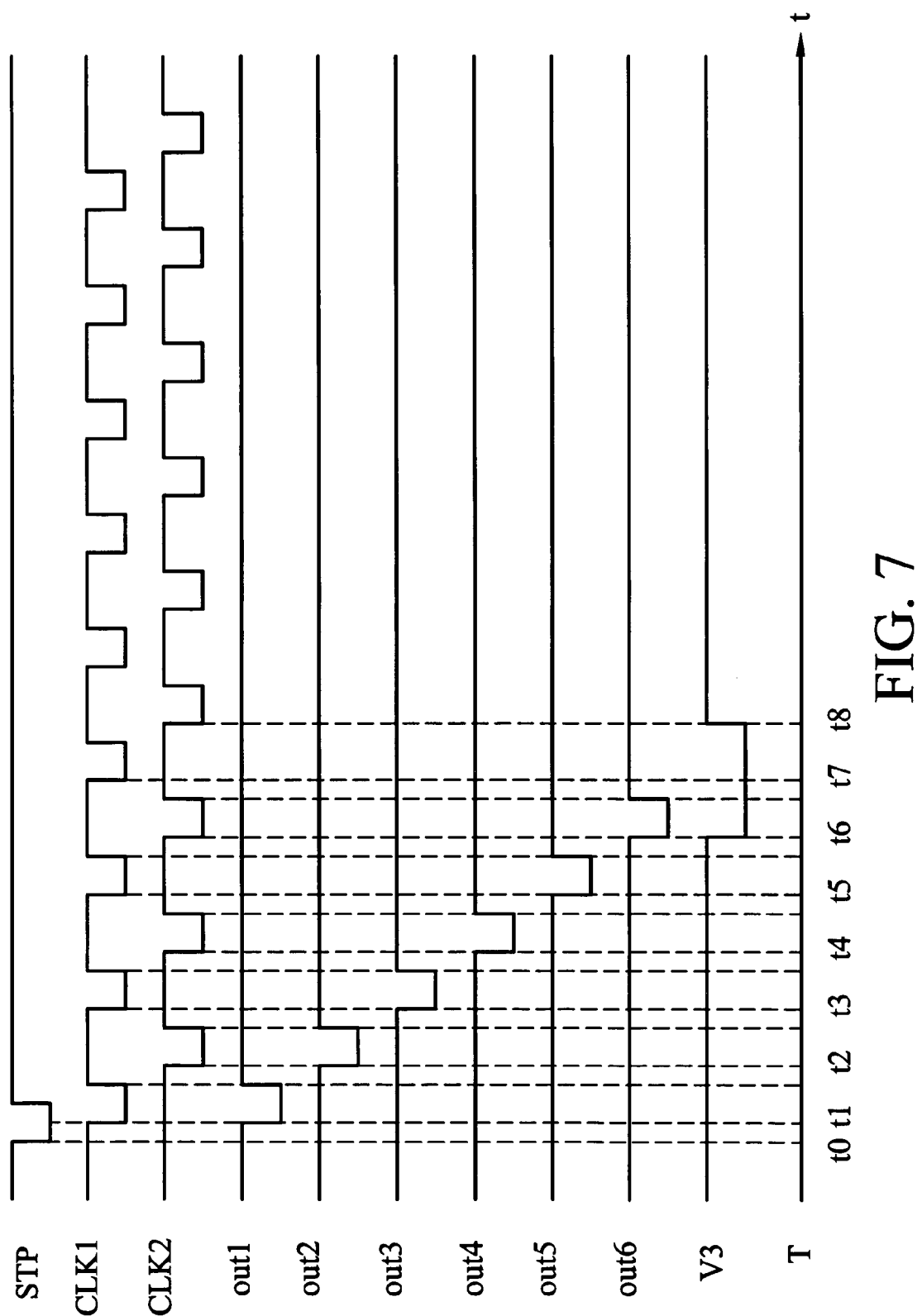
FIG. 7 is a timing chart of the embodiment of the pulse generation unit of FIG. 6.

FIG. 7 is a timing chart of the embodiment of the driving signal circuit of FIG. 5. As shown, description of the driving circuit 200B before time t7 is similar to that of the driving circuit 200A shown in FIG. 2, and thus is omitted for simplification. Operation of the driving circuit 200B after time t7 is disclosed hereinafter with reference to FIGS. 5, 6 and 7.

At time t7, the clock signal CLK1 goes low such that the transistor M05 is turned on. As transistors M05 and M06 are turned on, the second control terminal C2 of the shift register SR6 is pulled low, serving as a disabling signal SF to turn off the shift register SR6. Even if the clock signal CLK1 goes high, the voltage level at the second control terminal C2 of the shift register SR6 stays low such that the transistor M01 stays on.

At time t8, the clock signal CLK2 goes low such that the transistor M02 is turned on. As transistors M01 and M02 are turned on, the voltage level V3 at the node N3 is pulled high, and the pulse generation unit 220 is reset and disabled accordingly.

Pulse generation unit 220 in the signal driving circuit and the connection of the shift registers SR1~SR6 further ensure that all shift registers can be disabled by the driving pulse from the next stage and there is no current leakage to the previous stage from the next stage. Thus, output driving pulses output by the shift register SR1~SR6 can reach a desired voltage level.

Figure 8:
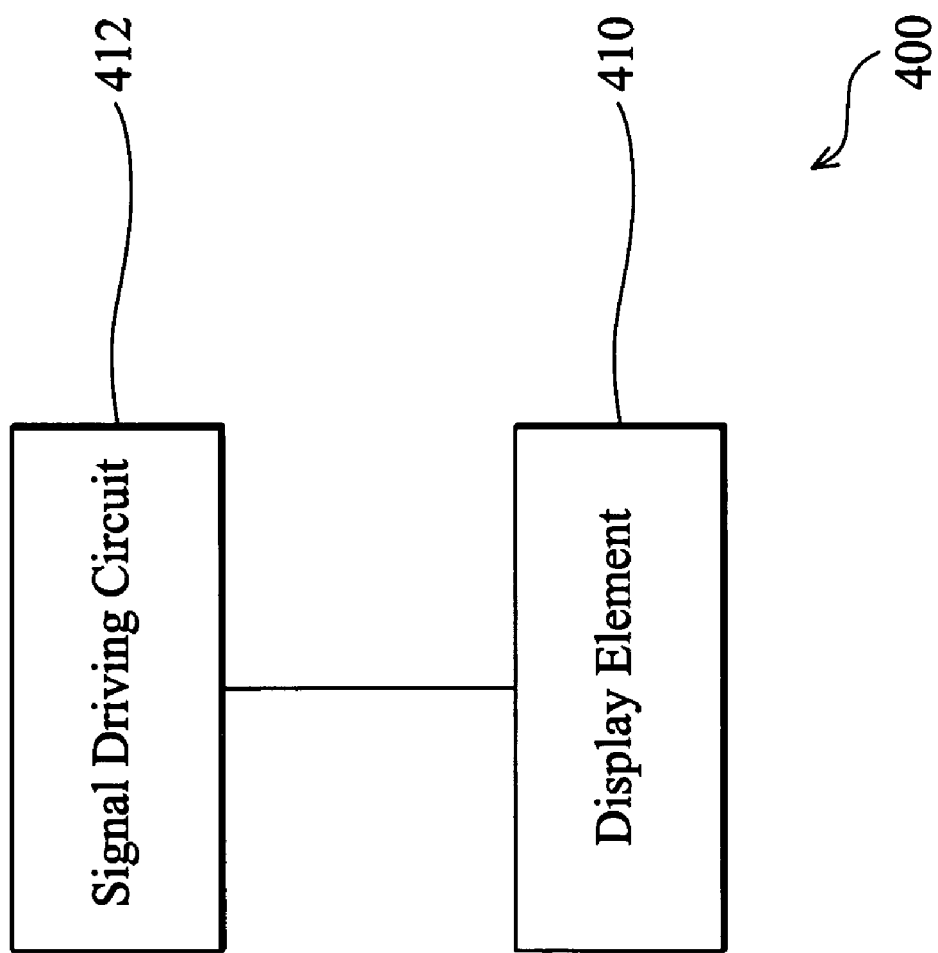
FIG. 8 shows an embodiment of a display device incorporating a signal driving circuit.

As shown in FIG. 8, an embodiment of a signal circuit can be incorporated into a display device. In particular, display device 400 incorporates a display element 410, such as an LCD element, and is operatively coupled to a signal driving circuit 412, such as signal driving circuit 200A or 200B, for example. The signal driving circuit outputs a plurality of driving pulses in turn to drive display element 410. Note that display element 410 can be a plasma display element, an organic light emitting display element, a field emission display (FED) systems, or a cathode ray tube display element in other embodiments.

Figure 9:
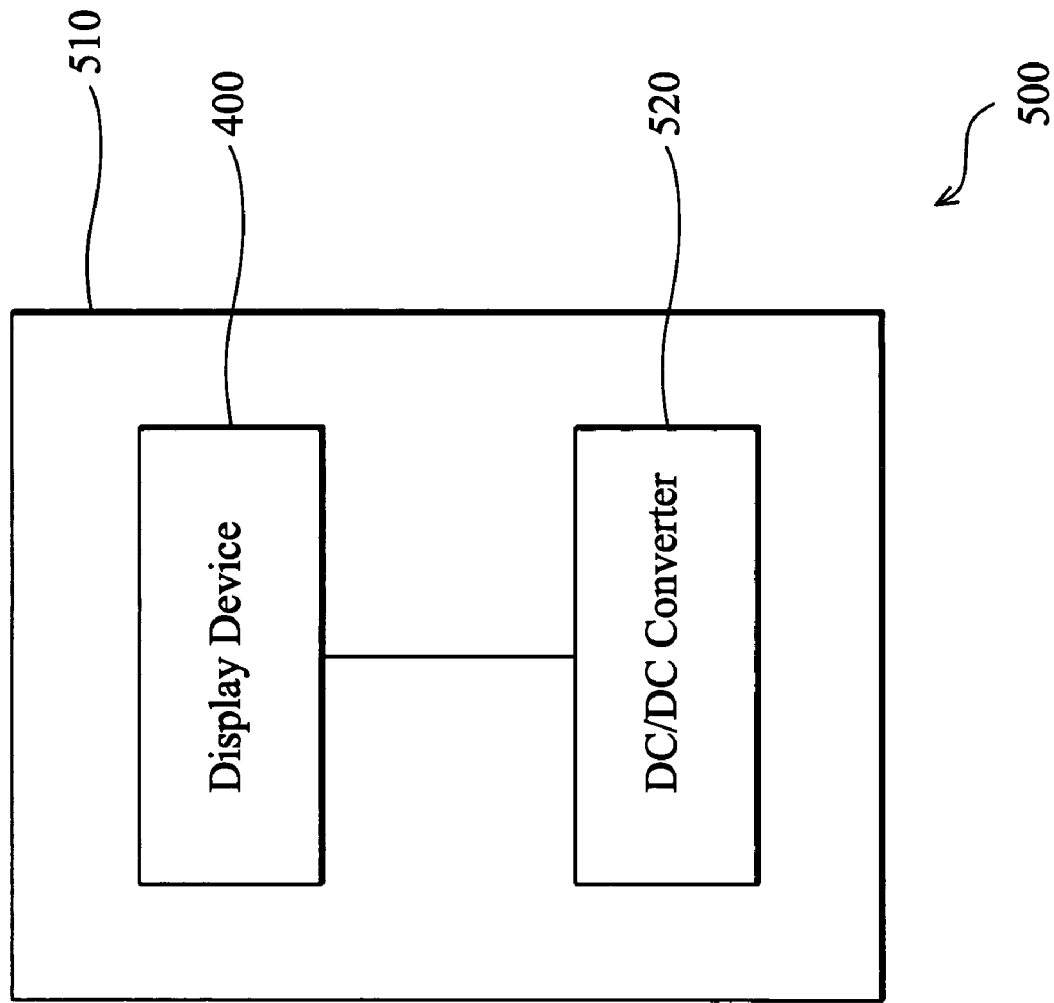
FIG. 9 schematically shows an embodiment of an electronic device incorporating an embodiment of a display device.

FIG. 9 schematically shows an electronic device 500 employing display device 400. The electronic device 500 may be a portable device such as a PDA, notebook computer, tablet computer, cellular phone, or a display monitor device, for example. Generally, the electronic device 500 includes a housing 510, the display device 400 and, a DC/DC converter 520. Further, the DC/DC converter 520 is operatively coupled to the display device 400 and provides an output voltage powering the display device 400 to display images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for driving a display comprising:
a signal driving circuit, comprising:
a plurality of shift registers connected in series, each comprising a first control terminal, a second control terminal, an input terminal and an output terminal, each being controlled by a first clock signal and a second clock signal and outputting corresponding driving pulses in turn according to a start pulse;
wherein the output terminal of an Nth of the shift registers is coupled to the input terminal of an N+1$^{th}$ of the shift registers, the output terminal of the N+1$^{th}$ shift register is coupled to the second control terminal of the N$^{th}$ shift register, and the first control terminals of the N$^{th}$ and the N+1$^{th}$ shift registers are coupled to the first clock signal and the second clock signal, respectively; and
a pulse generation unit comprising an input terminal coupled to a corresponding of the driving pulses from a last of the shift registers, a first control terminal coupled to the first clock signal, and a second control terminal coupled to the second clock signal, wherein the pulse generation unit outputs a disable pulse to disable the last of shift registers according to the received driving pulse and the first clock signal received by the first control terminal, and is disabled according to the second clock signal received by the second control terminal;
wherein the pulse generation unit is coupled to the last of the shift registers, comprising:
a first transistor, having a first terminal coupled to a power voltage, a control terminal coupled to the second control terminal of the last of the shift registers, and a second terminal;

a second transistor, having a first terminal coupled to the second terminal of the first transistor, a control terminal coupled to the second clock signal, and a second terminal coupled to a node;

a third transistor, having a first terminal coupled to the node, a control terminal coupled to a ground voltage, and a second terminal;

a forth transistor, having a first terminal coupled to the second terminal of the third transistor, a control terminal coupled to the output terminal of the last of the shift registers, and a second terminal coupled to the output terminal of the last of the shift registers;

a fifth transistor, having a first terminal coupled to the second control terminal of the last of the shift registers, a control terminal coupled to the first clock signal, and a second terminal; and a sixth transistor, having a first terminal coupled to the second terminal of the fifth transistor, a control terminal coupled to the node, and a second terminal coupled to the ground voltage.

2. The system as claimed in claim 1, wherein the plurality of shift registers comprises PMOS transistors.

3. The system as claimed in claim 1, wherein the disable pulse is output to the second control terminal of the last of the shift registers.

4. The system as claimed in claim 1, wherein the system comprises a display device, the display device comprising the signal driving circuit and a display element coupled to the signal driving circuit, wherein the display element is driven by the signal driving circuit.

5. The system as claimed in claim 4, wherein the display element is an organic light emitting display element.

6. The system as claimed in claim 4, wherein the system comprises an electronic device, and the display device is implemented in the electronic device for displaying images.

7. The system as claimed in claim 6, further comprising:
a DC/DC converter coupled to the display device, wherein the display device is powered by the DC/DC converter.

8. The system as claimed in claim 6, further comprising: means for powering the display device.

9. The system as claimed in claim 6, wherein the electronic device is a cellular phone.

10. A system for driving a display comprising:
a signal driving circuit, comprising:
a first shift register comprising a first control terminal coupled to a first clock signal, an input terminal coupled to a start pulse, a second control terminal, and an output terminal, wherein the first shift register outputs a first driving pulse according to the first clock signal and the start pulse;

a second shift register comprising a first control terminal coupled to a second clock signal, an input terminal coupled to the output terminal of the first shift register, an output terminal coupled to the second control terminal of the first shift register, and a second control terminal, wherein the second shift register is operative to output a second driving pulse according to the first clock signal and the first driving pulse, and the first shift register is disabled by the second driving pulse from the second shifter register; and a pulse generation unit comprising an input terminal coupled to a corresponding of the driving pulses from the second shift register, a first control terminal coupled to the first clock signal, and a second control terminal coupled to the second clock signal, wherein the pulse generation unit outputs a disable pulse to disable the second shift register according to the received driving pulse and the first clock signal received by the first control terminal, and is disabled according to the second clock signal received by the second control terminal;

wherein the pulse generation unit is coupled to the last of the shift registers, comprising:
a first transistor, having a first terminal coupled to a power voltage,
a control terminal coupled to the second control terminal of the last of the shift registers, and a second terminal;
a second transistor, having a first terminal coupled to the second terminal of the first transistor, a control terminal coupled to the second clock signal, and a second terminal coupled to a node;
a third transistor, having a first terminal coupled to the node, a control terminal coupled to a ground voltage, and a second terminal;
a forth transistor, having a first terminal coupled to the second terminal of the third transistor, a control terminal coupled to the output terminal of the last of the shift registers, and a second terminal coupled to the output terminal of the last of the shift registers;
a fifth transistor, having a first terminal coupled to the second control terminal of the last of the shift registers, a control terminal coupled to the first clock signal, and a second terminal; and
a sixth transistor, having a first terminal coupled to the second terminal of the fifth transistor, a control terminal coupled to the node, and a second terminal coupled to the ground voltage.

11. The system as claimed in claim 10, wherein the disable pulse is output to the second control terminal of the second shift register.

* * * * *